(12) United States Patent
Chen et al.

(10) Patent No.: US 8,994,181 B2
(45) Date of Patent: Mar. 31, 2015

(54) BOND PAD STRUCTURE TO REDUCE BOND PAD CORROSION

(75) Inventors: Ying-Ju Chen, Tuku Township (TW); Hsien-Wei Chen, Sinying (TW); Tsung-Yuan Yu, Taipei (TW); Shih-Wei Liang, Dajia Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 121 days.

(21) Appl. No.: 13/212,536

(22) Filed: Aug. 18, 2011

(65) Prior Publication Data

US 2013/0043598 A1 Feb. 21, 2013

(51) Int. Cl.
| | |
|---|---|
| H01L 23/48 | (2006.01) |
| H01L 23/29 | (2006.01) |
| H01L 23/31 | (2006.01) |
| H01L 23/522 | (2006.01) |
| H01L 23/00 | (2006.01) |

(52) U.S. Cl.
CPC .......... H01L 23/291 (2013.01); H01L 23/3192 (2013.01); H01L 23/5226 (2013.01); H01L 24/05 (2013.01); H01L 2224/0345 (2013.01); H01L 2224/03452 (2013.01); H01L 2224/0401 (2013.01); H01L 2224/04042 (2013.01); H01L 2224/04073 (2013.01); H01L 2224/05008 (2013.01); H01L 2224/05096 (2013.01); H01L 2224/05552 (2013.01); H01L 2224/05553 (2013.01); H01L 2224/05557 (2013.01); H01L 2224/05567 (2013.01); H01L 2224/05573 (2013.01); H01L 2224/05624 (2013.01); H01L 2224/05647 (2013.01); H01L 2224/05666 (2013.01); H01L 2224/05681 (2013.01); H01L 2224/05684 (2013.01); H01L 2224/45144 (2013.01); H01L 2224/45147 (2013.01); H01L 2224/05572 (2013.01); H01L 2224/131 (2013.01); H01L 2224/13147 (2013.01)

USPC ............ 257/774; 257/E23.011; 257/E21.557; 438/612

(58) Field of Classification Search
CPC ...................... H01L 2224/02166; H01L 24/05; H01L 2224/05554; H01L 2224/05558; H01L 24/03; H01L 2924/00014; H01L 2924/00012; H01L 2224/0345; H01L 2224/03452; H01L 2224/05552; H01L 2224/05572; H01L 2224/05624; H01L 2224/05647; H01L 2224/05666; H01L 2224/05681; H01L 2224/05684
USPC .................... 257/786, E23.02, E23.015, 760, 257/E21.577, E23.011, 774; 438/612
See application file for complete search history.

(56) References Cited

U.S. PATENT DOCUMENTS

| | | | | |
|---|---|---|---|---|
| 7,364,998 | B2 * | 4/2008 | Chiu et al. ..................... | 438/597 |
| 7,592,710 | B2 * | 9/2009 | Hsia et al. ..................... | 257/786 |
| 8,183,698 | B2 * | 5/2012 | Antol et al. .................... | 257/780 |
| 2003/0020163 | A1 * | 1/2003 | Hung et al. .................... | 257/734 |
| 2004/0070042 | A1 * | 4/2004 | Lee et al. ....................... | 257/459 |
| 2005/0082577 | A1 * | 4/2005 | Usui .............................. | 257/211 |
| 2006/0006552 | A1 * | 1/2006 | Kang et al. .................... | 257/786 |
| 2012/0299187 | A1 * | 11/2012 | Oertle et al. .................. | 257/762 |

* cited by examiner

Primary Examiner — Stephen W Smoot
Assistant Examiner — Edward Chin
(74) Attorney, Agent, or Firm — Lowe Hauptman & Ham, LLP

(57) ABSTRACT

Mechanisms of forming a bond pad structure are provided. The bond pad has a recess region, which is formed by an opening in the passivation layer underneath the bond pad. An upper passivation layer covers at least the recess region of the bond pad to reduce trapping of patterning and/or etching residues in the recess region. As a result, the likelihood of bond pad corrosion is reduced.

20 Claims, 7 Drawing Sheets

BOND PAD STRUCTURE TO REDUCE BOND PAD CORROSION

BACKGROUND

This disclosure relates generally to integrated circuits and, more particularly, to a bond pad structure.

Integrated circuits are typically formed on a substrate such as a semiconductor wafer. Bond pads (or bonding pads) are included on the substrate. A bond pad provides an interface to an integrated circuit device through which an electrical connection to the device may be made. Previous techniques known to the inventors may be used to provide a connection from a package terminal to an integrated circuit using the bond pad, such as thermocompression or thermosonic wire bonding, flip chip techniques, and other techniques.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
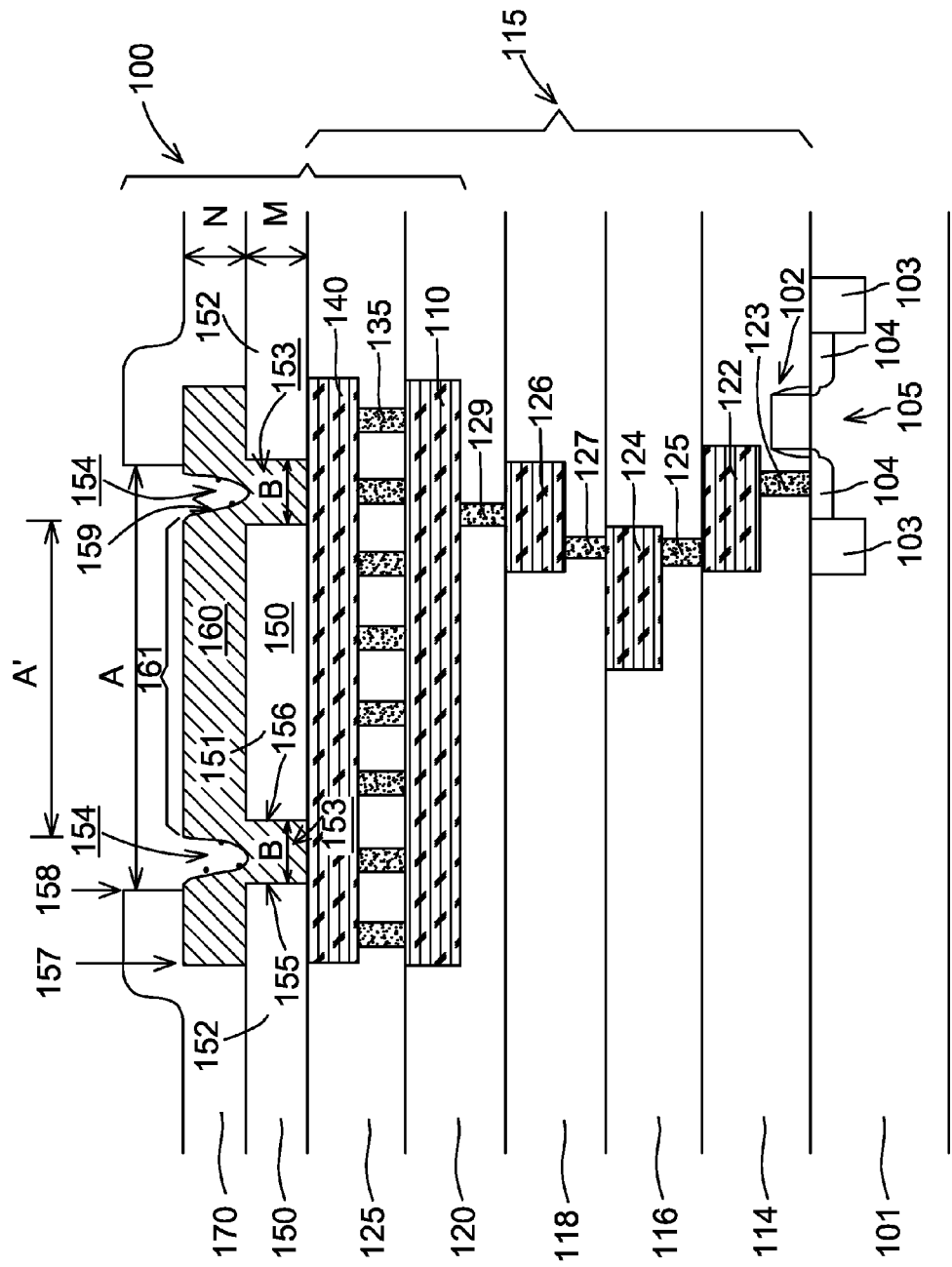
FIG. 1A shows a cross-sectional view of a bond pad structure, in accordance with some embodiments.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Additionally, descriptive terms such as upper/lower, top/bottom, and vertical/horizontal are used for ease of description and do not provide any limitation to an absolute direction. For example, an upper layer and a lower layer may indicate a respective relationship relative to a substrate or integrated circuit formed on a substrate, rather than absolute direction.

Referring now to FIG. 1A, illustrated is a cross-sectional view of an embodiment of a bond pad structure (e.g., a bond pad and bond pad connections) 100. The bond pad structure 100 may be formed on a substrate 101 including an integrated circuit or portion thereof. The substrate 101 may be a semiconductor wafer such as silicon wafer. Alternatively, the substrate may include other elementary semiconductor materials such as germanium, a compound semiconductor such as silicon carbide, gallium arsenic, indium arsenide, and indium phosphide, an alloy semiconductor material such as silicon germanium, silicon germanium carbide, gallium arsenic phosphide, and gallium indium phosphide, and/or other substrate compositions.

FIG. 1A shows an exemplary device 105 with a gate structure 102 and source and drain regions 104. In some embodiments, device 105 is separated from other devices (not shown) by isolation structures 103. The substrate 101 typically includes conductive, insulative, and semiconductor layers patterned to form an integrated circuit. The substrate may include an interconnect structure 115 (e.g., multilayer interconnect (MLI) or a plurality of conductive traces and interlayer dielectric) to which the device 105 and the bond pad 160 of the bond pad structure 100 are electrically connected.

The integrated circuit is formed using, for example, conductive layers, semiconductive layers, and insulative layers disposed on the substrate. In one embodiment, the multilayer interconnect (MLI) structure 115 is formed including conductive lines (vias and contacts) and interlayer dielectric (ILD) layers. The formed bond pad structure, described below with reference to step 945, provides electrical contact to devices, including the interconnect structure, from outside of the substrate, e.g., from package terminal. The conductive lines of the interconnect structure may include materials such as aluminum, aluminum/silicon/copper alloy, titanium, titanium nitride, tungsten, polysilicon, metal silicide, copper, copper alloy, titanium, titanium nitride, tantalum, tantalum nitride, tungsten, polysilicon, metal silicide (such as, nickel silicide, cobalt silicide, tungsten silicide, tantalum silicide, titanium silicide, platinum silicide, erbium silicide, palladium silicide, or combinations thereof), and/or other suitable materials. The interconnect structure may be formed by processes including physical vapor deposition (or sputtering), chemical vapor deposition (CVD), plating, and/or other suitable processes. Other manufacturing techniques used to form the interconnect structure may include photolithography processing and etching to pattern the materials for vertical (via and contact) and horizontal connects (conductive line), and may be followed by an etchback or chemical mechanical polish (CMP) process. Still other manufacturing processes such as thermal annealing may be used to form metal silicide on the substrate included in the MLI.

The ILD layers of the MLI may include materials such as silicon oxide, a material having a low dielectric constant such as a dielectric constant (k) less than about 2.5 (e.g., extra low k (ELK)), silicon nitride, silicon oxynitride, polyimide, spin-on glass (SOG), fluoride-doped silicate glass (FSG), undoped silica glass (USG), carbon doped silicon oxide (SiOC), BLACK DIAMOND® (Applied Materials of Santa Clara, Calif.), Xerogel, Aerogel, amorphous fluorinated carbon, Parylene, BCB (bis-benzocyclobutenes), SILK™ (Dow Chemical, Midland, Mich.), polyimide, and/or other suitable materials. In an embodiment, the dielectric layer 120 includes a low dielectric constant (k) dielectric. In some embodiments, the low k dielectric has a dielectric constant (k) of in a range from about 2.5 to about 2.9. The low k dielectric may be a porous dielectric. The dielectric layers may be formed by techniques including spin-on, CVD, and/or other suitable processes and may be followed by an etchback or CMP process. The interconnect structure may be formed in an integrated process such as a damascene process or lithography/plasma etching process.

In an embodiment, the bond pad structure 100 includes a circuit under pad (CUP) structure. In a CUP structure, a bond pad 160 may be disposed over active circuitry of an integrated circuit, or portion thereof. For example, device 105 may be part of the integrated circuit under bond pad structure 100. In an embodiment, the bond pad structure 100 is a CUP structure and is disposed over the input/output (I/O) cell of an integrated circuit. Advantages of CUP include shortening the conductors, thus decreasing their resistance and capacitance, which may reduce the parasitic capacitance of the integrated circuit. Other advantages include saving space. In other embodiments, the integrated circuit is only partially under bond pad 160 and interconnect structures are used to electrically connect devices not directly under bond pad 160 to bond pad 160. The exposed bond pad 160 may be used for electrical probing and/or for forming a bonding ball attached to a bonding wire, both of which are not shown in FIG. 1A, to electrically connect to external contacts. For example, the bonding ball and wire may be made of copper or gold. Other materials may also be used. Alternatively, the exposed bond pad 160 may be used to form other types of conductive packaging structures, such as bumps or balls. The bumps and balls may include copper and/or solder. The bumps may also be copper posts.

The bond pad structure 100 may include a lower conductive layer 110, a number of conductive vias 135, an upper conductive layer 140, dielectric layers 120 and 125, passivation layers 150 and 170, and a bond pad 160, in accordance with some embodiments. The conductive vias 135 are disposed on the lower conductive layer 110. The upper conductive layer 140 disposed on the conductive vias 135 such that the conductive vias 135 interpose the lower conductive layer 110 and the upper conductive layer 140. The conductive vias 135 provide an electrical connection between the upper conductive layer 140 and the lower conductive layer 110. The upper conductive layer 140, the conductive vias 135, and the lower conductive layer 110 may be electrically connected to and/or be a portion of, an interconnect structure 115 (e.g., an MLI). The Interconnect structure 115 may have a number of metal layers, such as conductive layers 110, 140, 126, 124, and 122 etc. The Interconnect structure 115 also may have a number of vias/contacts, such as vias/contacts 129, 127, 125, and 123, etc. The conductive layers 110, 140, 126, 124, and 122, and the vias/contacts 135, 129, 127, 125 and 123 are surrounded by inter-level dielectric (ILD) layers 125, 120, 118, 116, and 114 respectively, in accordance with some embodiments. In some embodiments, the first dielectric layer 114 may be phosphorous-doped silicon glass (PSG) and may be deposited by a high-density plasma CVD (HDPCVD) process or a sub-atmospheric CVD (SACVD) process.

Alternatively, the bond pad structure 100 includes the upper conductive layer 140, the passivation layers 150, 170, and the bond pad 160. The bond pad structures 100 connects to other metal layers, such as layer 110, through vias, such as conductive vias 135

The upper conductive layer 140 and the lower conductive layer 110 are illustrated as continuous structures of conductive material. In other embodiments, the bond pad structure 100 includes an intermediate conductive layer (not shown) to replace the conductive vias 135. The intermediate conductive layer could be a solid layer (e.g., pad) of conductive material disposed between layers 140 and 110. Other types of conductive structures may also be used to replace the conductive vias 135 to provide electrical connections between conductive layers 110 and 140. Examples of such other types of conductive structures and conductive layers are described in U.S. patent application Ser. No. 12/026,312, titled "Bond Pad Structure," and filed on Feb. 5, 2008, which is incorporated herein by reference in its entirety.

The upper conductive layer 140 is electrically and physically coupled to the bond pad 160. The bond pad 160 may include one or more layers of conductive materials. For example, it may include a main conductive layer and one or more barrier layers. The bond pad 160 may be formed using deposition techniques, such as sputtering, CVD, plating, and/or other suitable processes. In an embodiment, the bond pad includes aluminum or aluminum alloy. Examples of other materials that may be included in the bond pad are titanium, tantalum, copper, tungsten, combinations thereof including alloys, and/or other suitable conductive materials. In some embodiments, a barrier layer underneath the main conductive layer is made of TaN, TiN, or a combination of thereof.

The upper conductive layer 140 may be a top metal layer (or $M_{top}$ layer) and the lower conductive layer 110 may be a layer below the top metal layer (or $M_{top-1}$ layer), in some embodiments. In other embodiments, the upper conductive layer 140 may be a redistribution layer (RDL). The interconnect structure 115 provides electrical connections between the bond pad 160 and devices, such as device 105 on substrate 101. The bond pad structure 100 may also include the dielectric layers 120 and 125. In some embodiments, the dielectric layers 120 and 125 are unitary (e.g., a single dielectric layer). Materials described above for forming ILD layer may be used for dielectric layers 120 and/or 125.

The bond pad structure 100 also includes the passivation layers 150 and 170. The passivation layers 150 and/or 170 may include silicon oxide, silicon nitride, silicon oxynitride, and/or other suitable materials. In some embodiments, the passivation layers 150 and 170 are formed by plasma processes. The openings in the passivation layers 150 (passivation layer I) and 170 (passivation layer II) expose the bond pad 160 providing a bonding area. The bonding area 161 has a width, A', which is smaller than the opened bond pad area having a width A. In some embodiments, the width A is in a range from about 20 μm to about 100 μm. The bonding area 161 includes the area of the bond pad 160 available for bonding, for example, for placement of a ball, wedge, or bump. The thicknesses of passivation layer I 150, M, is in a range from about 5,000 Å to about 15,000 Å, in accordance with some embodiments. The thicknesses of passivation layer II 170, N, is in a range from about 5,000 Å to about 20,000 Å, in accordance with some embodiments.

In some embodiments, the passivation region (or structure) 151 of the passivation layer I 150 is omitted. Under such circumstance, the majority of the bond pad 160 comes in contact with the upper conductive layer 140. FIG. 1A shows that the passivation region 151 is placed between the passivation regions 152 and is separated from passivation regions 152 by openings 153. The existence of the passivation structure 151 could reduce the stress exerted on bond pad 160 during probing of bond pad 160 or during connecting a bonding wire to the bond pad 160.

One or more of the openings (or vias) 153 may have a width B. In some embodiments, the width B is in a range from about 1,000 Å to about 40,000 Å. In some other embodiments, the width B is in a range from about 20,000 Å to about 30,000 Å. Due to openings 153, bond pad 160 forms recess region(s) 154. In some embodiments, the recess region(s) 154 are deep and narrow due to the high aspect ratios (M/B) of openings 153. The deep and narrow recess region(s) 154 could trap patterning and etch residues 159, which are not cleaned from the substrate surface. In forming the patterns of bond pad 160 and the passivation layer II 170, a photoresist layer needs to be deposited and patterned on each of the layers. After the photoresist layer is patterned by photolithography and by using a developer to create openings, the exposed metal areas of bond pad 160 or the exposed dielectric areas of passivation layer II 170 is etched by an etching chemistry, which often involves plasma. The residues of photoresist patterning and/or etching material layer (bond pad 160 or passivation layer II 170) could be trapped in recess region(s) 154.

Examples of patterning and etch residues may include, but are not limited to, polymers, chlorine-containing species, fluorine-containing species, and/or oxygen-containing species. The etch species are corrosive and could result in corrosion of bond pad 160. Corrosion of bond pad 160 could result in poor or no contact between the bond pads 160 and bonding wires and cause degradation in yield. Metal corrosion could worsen with time and the corroded area(s) could increase with time. For example, the residues may react with oxygen and moisture in the air and become corrosive or more corrosive. Therefore, the corroded area(s) would grow with time. The corroded area(s) could also spread to the neighboring region(s) that was previously un-affected. Therefore, metal corrosion could also become a reliability issue and needs to be dealt with.

In some embodiments, the residues mainly come from the formation of the passivation layer II 170. The residues from forming the bond pad 160 may be mostly removed during the deposition of the passivation layer II 170, which utilizes a plasma process. The plasma process removes the residues left in the recess region(s) 154 after the formation of bond pad 160. The residues in recess regions 154 could significantly come from the patterning of the passivation layer II 170. Therefore, covering the recess regions 154 could greatly reduce the occurrence of corrosion of bond pad 160.

FIG. 1A shows that the edges 155 of passivation regions 152 and the edges 156 of passivation region 151, in accordance with some embodiments. FIG. 1A also shows that the edges 157 of bond pad 160 and the edges 158 of passivation layer II 170, in accordance with some embodiments.

Figure 1B:
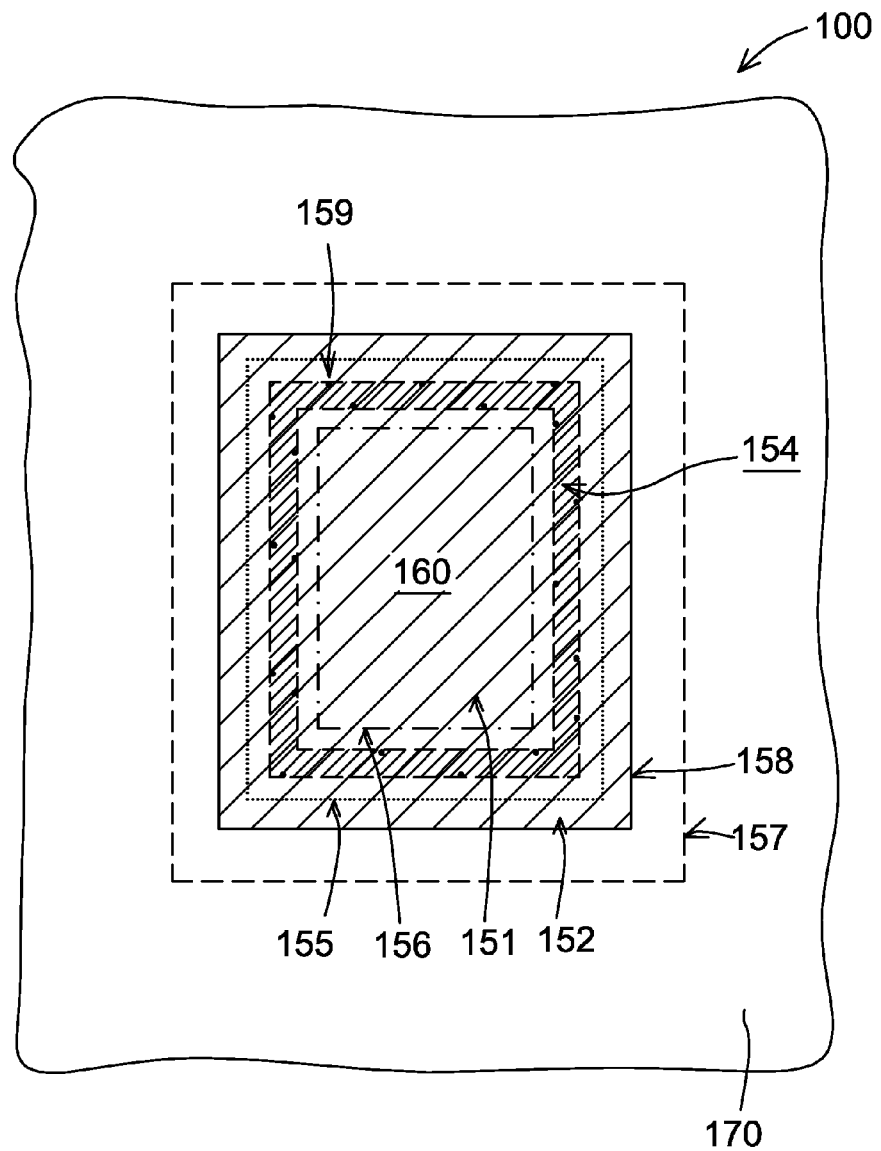
FIGS. 1B-1D show top views of various embodiments of the bond pad structure of FIG. 1A.
Figure 1C:
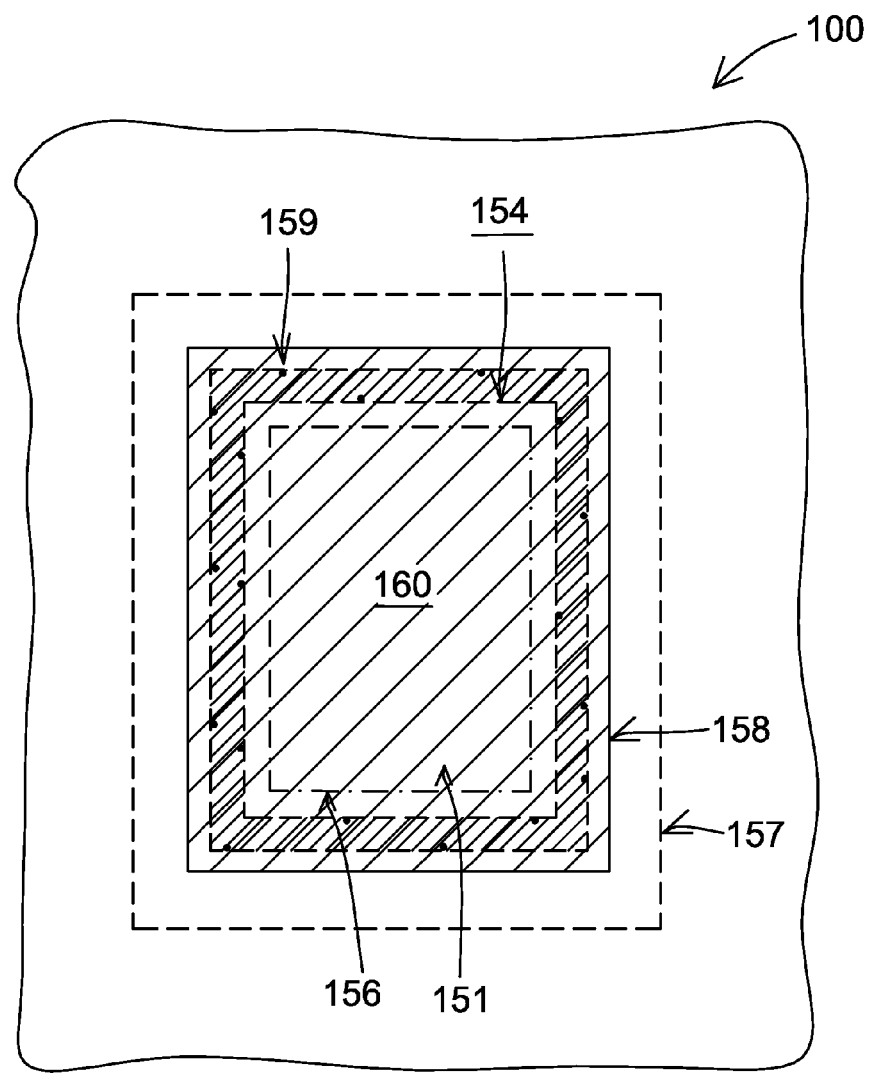

FIG. 1B shows a top view of bond pad structure 100 of FIG. 1A, in accordance with some embodiments. FIG. 1B shows passivation layer II 170 with an opening having rectangular edges 158. The opening exposes the bond pad 160, which has a recess region(s) 154, which trap residues 159. A portion of bond pad 160 is covered by the passivation layer II 170 and the edges 157 of the bond pad are marked by a rectangular box (dotted). The passivation layer I 150 is either under passivation layer II 170 or under bond pad 160. FIG. 1B shows the edges 156 of passivation region 151 and the edges 155 of passivation regions 152. The embodiment shown in FIG. 1B is merely an example. Other shapes of bond pad 160 and outlines of passivation layer I 150 or passivation layer II 170 are also possible. For example, the edges 155 of passivation region 152 of the passivation layer I 150 could be between the edges 157 and the edges 158. Alternatively, the edges 155 of passivation region 152 could be directly under the edges 158. FIG. 1C shows a top view of another embodiment of structure 100, in accordance with some embodiments. In the embodiment shown in FIG. 1C, the edges 155 of passivation regions 152 of the passivation layer I 150 are directly under the edges 158 of the passivation layer II 170.

Figure 1D:
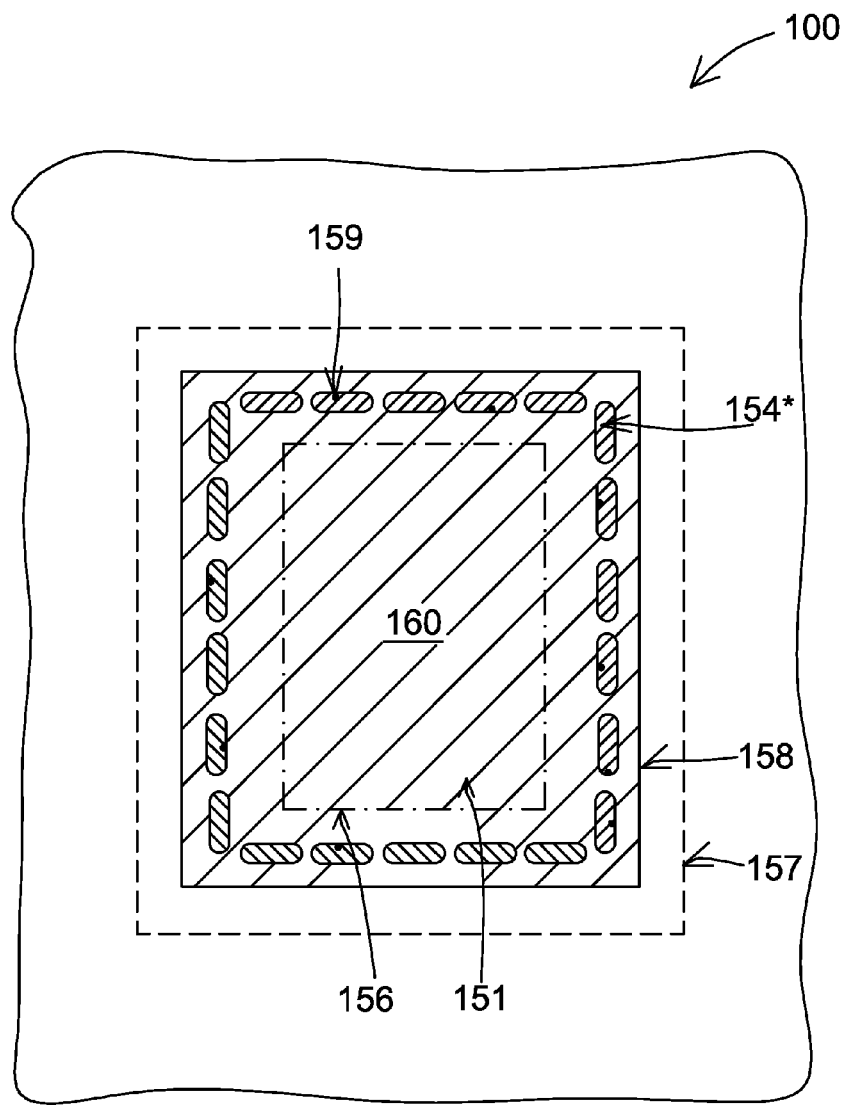

As mentioned above, other shapes of bond pad 160, outlines of passivation layer I 150, or passivation layer II 170 are also possible. FIG. 1D a top view of another embodiment of structure 100, in accordance with some other embodiments. FIG. 1D is similar to FIG. 1C with the exception that the recess regions 154 are discontinuous. FIG. 1D shows that each of the recess region, such as region 154*, is a rectangle or a rounded rectangle. However, the recess region 154* could be in other shapes. FIG. 1D shows that the recess regions 154* form a discontinuous ring near the edge of the pad 160. In some embodiments, the recess region 154* form two or more continuous and/or discontinuous rings. The recess regions 154* may also form a mixture of continuous and discontinuous rings. In some embodiments, the rings are concentric.

Figure 2A:
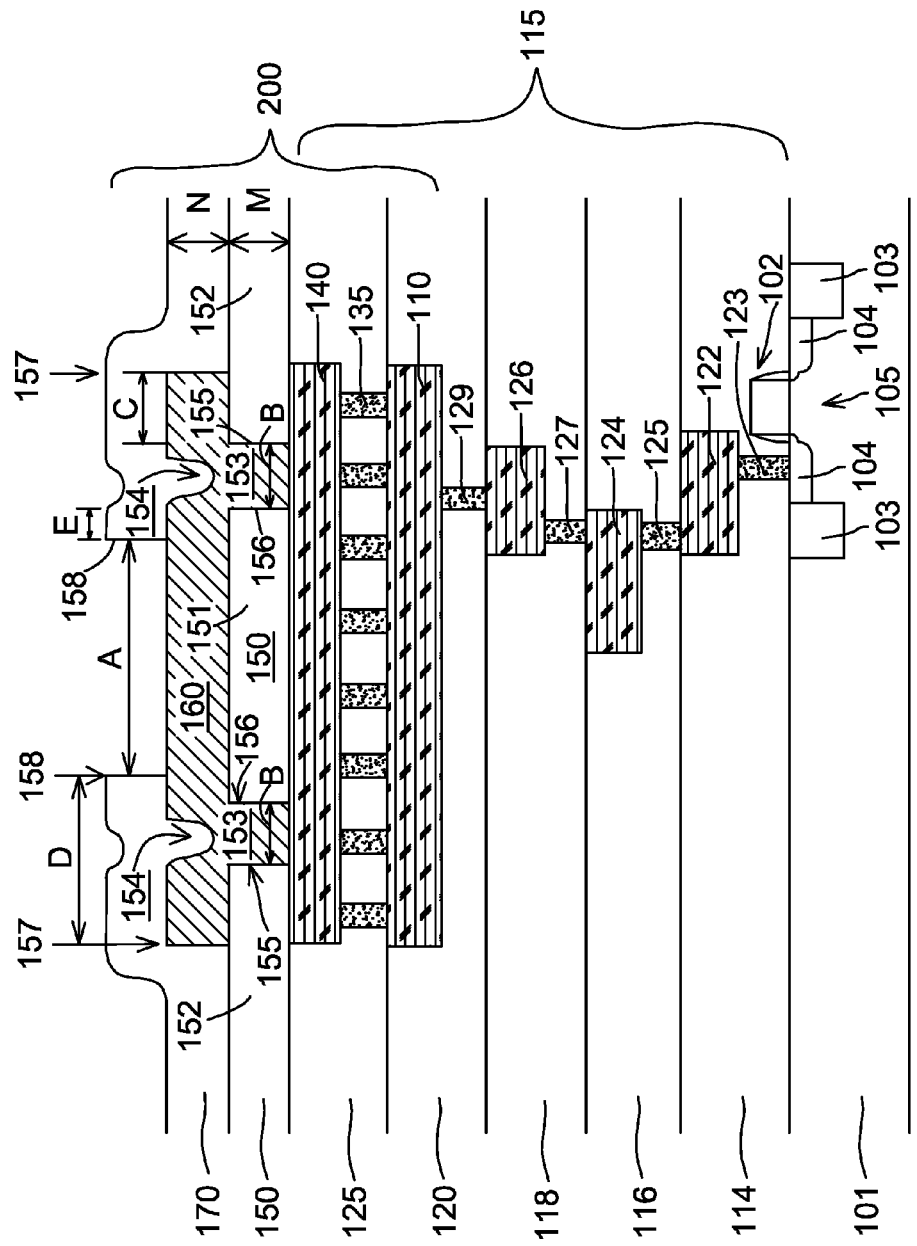
FIG. 2A shows a cross-sectional view of a bond pad structure, in accordance with some embodiments.

FIG. 2A shows a bond pad structure 200, in accordance with some embodiments. The bond pad structure 200 is similar to the bond pad structure 100 of FIG. 1A. However, the passivation layer II 170 covers the recess region(s) 154. By covering recess region(s) 154, the residues from the patterning and etching of the passivation layer II 170 cannot get inside recess region(s) 154. Even if there is a small amount of residues from patterning and etching of the bond pad 160 trapped in recess region(s) 154, the residues in recess region(s) 154 are not exposed to air or moisture in the environment. As a result, residues are less likely to become corrosive. Even if the residues are slightly corrosive, the corroded regions are more likely to be limited and contained by the covering passivation layer II 170. As mentioned above, the plasma deposition process of the passivation layer II 170 could have removed most of the residues from the formation of the bond pad 160. In some embodiments, an additional pre-treatment process may be added after the patterning and etching of bond pad 160 to drive out (or evaporate) potential moisture or polymeric residues before the passivation layer II 170 is deposited on the substrate. In some embodiments, the pre-treatment process is a sputtering process. The gaseous species used in the sputtering process may include an inert gas, such as Ar, He, or other type of inert gas. For example, an Ar sputtering may remove surface residue. Alternatively, the pre-treatment process may be a plasma treatment, or an annealing process. For example, a plasma treatment process using an inert gas could remove surface residues. The plasma treatment may be biased or not-biased. A plasma process with a bias could direct plasma to the substrate surface with high ionic energy. The annealing may be conducted at a temperature in a range from about 75° C. to about 350° C. for a duration in a range from about 1 minute to about 30 minutes. The annealing process may evaporate surface residues.

The width of openings in passivation layer II 170 is A. In some embodiments, the width A is in a range from about 20 μm to about 100 μm. It is important to have sufficient coverage of bond pad 160 over the openings 153 in passivation layer I 150. In some embodiments, the distance(s) "C" between the outer edge(s) of bond pad 160 and the outer edge(s) of openings 153 (or the distance between neighboring edges 157 and edges 155) is in a range from about 0.1 μm (or 1,000 Å) to about 2.0 μm. If the distance(s) C are too small, the edge(s) of bond pad 160 could fall inside openings 153 due to misalignment. When this occurs, the bond pad 160 would not be properly cleaned and residues could be trapped at the edges of bond pad 160 falling inside openings 153. In addition, sufficient coverage of passivation layer II 170 over bond pad 160, especially recess region(s) 154, is important. In some embodiments, the distance(s) "E" between the edges 158 of passivation layer II 170 and neighboring inner edges 156 of openings 153 of passivation layer I 150 is equal to or greater than about zero, in accordance with some embodiments. The deposition of the bond pad 160 would make the width(s) of recess region(s) 154 smaller than the width(s) of openings 153. Distance(s) E allow sufficient coverage of passivation layer II 170 over the recess region(s) 154 of bond pad 160, in accordance with some embodiments. In some embodiments, distance E is equal to or greater than about zero. In some embodiments, distance E is equal to or greater than about 0.1 μm.

In some embodiments, distance(s) "D" between the edges 158 of the passivation layer II 170 and neighboring edges 157 of bond pad 160 are specified to ensure sufficient coverage of bond pad 160 and recess region(s) 154 by passivation layer II 170. In some embodiments, the distance(s) D are in a range from about 5000 Å to about 30,000 Å. The aspect ratios (M/B) of openings 153 in passivation layer I 150 affect the sizes and aspect ratios of recess region(s) 154 in bond pad 160. In some embodiments, the aspect ratios of openings 153 are equal to or less than about 2.0. Aspect ratios that are too high make cleaning of recess region(s) 154 difficult and enable trapping of unacceptable amount of residues.

Figure 2B:
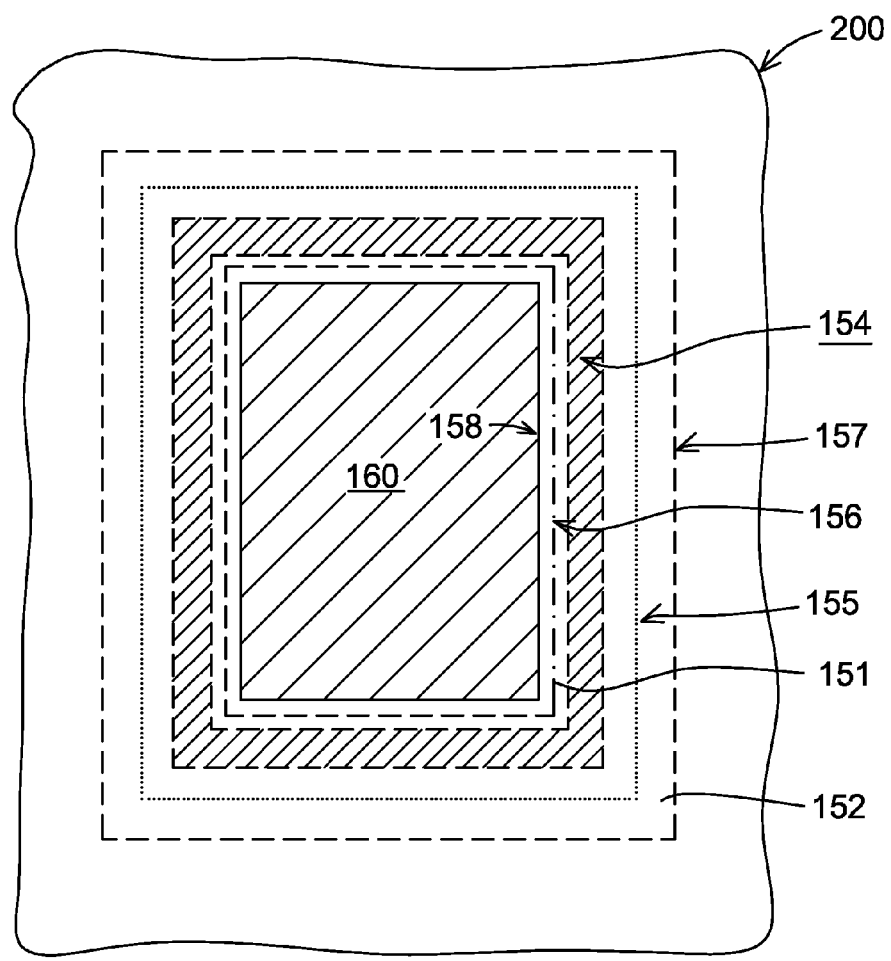
FIG. 2B shows a top view of the bond pad structure of FIG. 2A, in accordance with some embodiments.

FIG. 2B shows a top view of bond pad structure 200 of FIG. 2A, in accordance with some embodiments. FIG. 2B shows that the recess region(s) 154 are completely covered by passivation layer II 170. There are no residues in recess region(s) 154. As mentioned above, even if there are small amount of residues 159 in recess region(s) 154, they are covered by passivation layer II 170 and are not exposed to moisture and air. As a result, corroded areas are limited and are less likely to grow with time.

Figure 3:
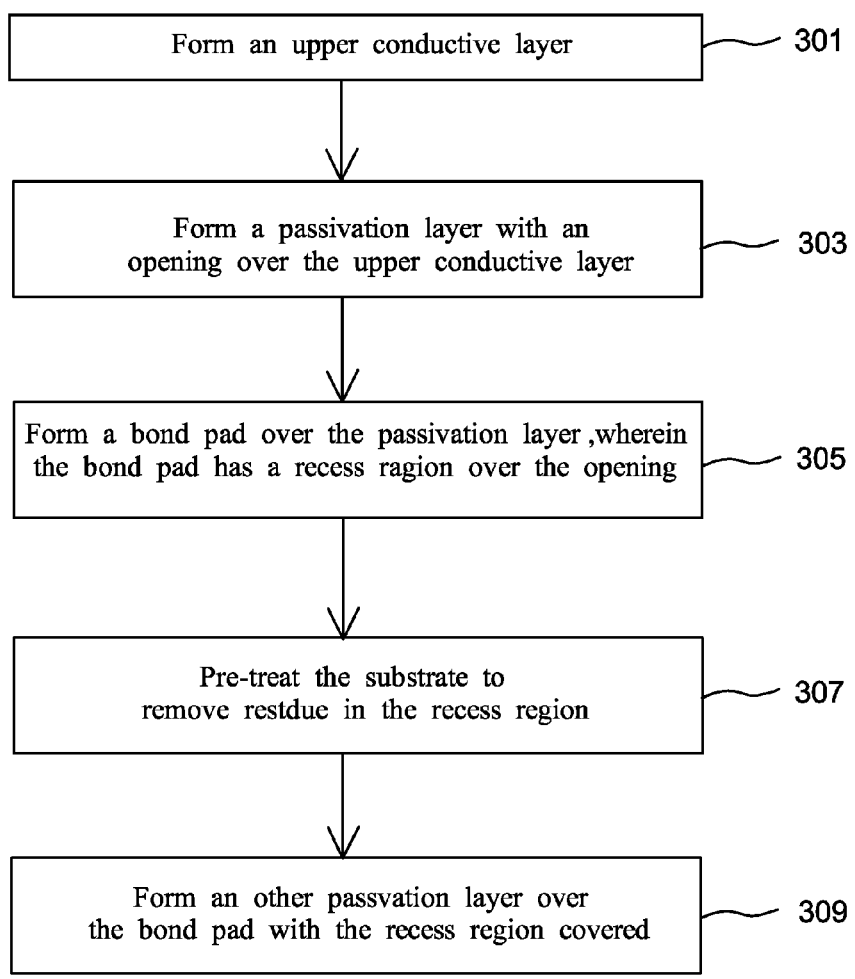
FIG. 3 shows a process flow of forming a bond pad structure, in accordance with some embodiments.

FIG. 3 shows a process flow 300 of forming a bond pad structure, in accordance with some embodiments. At operation 301, an upper conductive layer (or structure) is formed on a substrate. The upper conductive layer may be formed by a dual or a single damascene process, in accordance with some embodiments. In some embodiments, the upper conductive layer is similar to the upper conductive layer 140 of FIGS. 1A and 2A. As mentioned above, the upper conductive layer may be a part of MLI and is physically and/or electrically connected the remaining portion of the MLI and the devices connected to the MLI. Alternatively, the upper conductive layer may be a redistribution layer. Operation 301 may also include forming a lower conductive layer (or structure) underneath the upper conductive layer. In some embodiments, the lower conductive layer is similar to the lower conductive layer 110 described above. Operation 301 may further include forming conductive vias between the upper and the lower conductive layers. The conductive vias are similar to the conductive vias 135, in accordance with some embodiments.

After the upper conductive layer is formed, a passivation layer is formed over the upper conductive layer at operation 303. The passivation layer covers at least a portion of the upper conductive layer and may cover other portions of the substrate. The passivation layer is similar to passivation layer 150 described above and includes structures 151 and 152 with openings 153. Afterwards, a bond pad (structure) is formed over the passivation layer at operation 305. The bond pad (structure) is similar to bond pad 160, which covers a passivation structure 151 and portions of passivation structures 152. Both passivation structures 151 and 152 are part of the passivation layer. The bond pad structure also fills in the openings 153 and forms recess region(s) 154. Afterwards, process flow 300 may undergo an optional operation of pre-treating the substrate at operation 307 to remove the trapped residues in recess regions 154 of bond pad 160. Examples of the pre-treatment process have been described above. Another passivation layer (or structure) is then formed over the bond pad structure at operation 309. The other passivation layer is similar to passivation layer II 170, which has an opening that exposes a portion of the bond pad structure. This passivation layer covers the recess region(s) of the bond pad structure to prevent the accumulation of residues and to encapsulate the residues in the recess region(s), if such residues exist. After this passivation layer is formed, the bond pad structure may be probed or be connected to a bonding wire.

The present disclosure provides mechanisms of forming a bond pad structure. The bond pad has a recess region, which is formed by an opening in the passivation layer underneath the bond pad. An upper passivation layer covers the recess region of the bond pad to reduce trapping of patterning and/or etching residues in the recess region. As a result, the likelihood of bond pad corrosion is reduced.

In some embodiments, a bond pad structure is provided. The bond pad structure includes a first passivation layer, and the first passivation layer covers a portion of an upper conductive layer and exposes the upper conductive layer via a first opening. The bond pad structure also includes a bond pad, and the bond pad covers a portion of the first passivation layer. The bond pad covers the first opening in the first passivation layer to from a recess region, and the bond pad comes in contact with the upper conductive layer exposed by the first opening. The bond pad structure further includes a second passivation layer, and the second passivation layer covers the recess region in the bond pad.

In some other embodiments, a bond pad structure is provided. The bond pad structure includes an upper conductive layer, and a lower conductive layer. The lower conductive layer is below the upper conductive layer. The bond pad structure also includes conductive vias disposed between the upper conductive layer and the lower conductive layer to provide electrical connection between them. The bond pad structure further includes a first passivation layer, and the first passivation layer covers a portion of the upper conductive layer and exposes the upper conductive layer via a first opening. In addition, the bond pad structure includes a bond pad, and the bond pad covers a portion of the first passivation layer. The bond pad covers the first opening in the first passivation layer to from a recess region, and the bond pad comes in contact with the upper conductive layer exposed by the first opening. Additionally, the bond pad structure includes a second passivation layer, wherein the second passivation layer covers the recess region in the bond pad.

In yet some other embodiments, a method of forming a bond pad structure on a substrate is provided. The method includes forming an upper conductive layer on the substrate, and forming a first passivation layer over the upper conductive layer. The first passivation layer has a first opening, and the first opening exposes the upper conductive layer. The method also includes forming a bond pad over the first passivation layer, and the bond pad covers the first opening in the first passivation layer to form a recess region. In addition, the method includes forming a second passivation layer, wherein the second passivation layer covers the recess region in the bond pad.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A bond pad structure, comprising:
an upper conductive layer embedded in a dielectric layer;
a first passivation layer, wherein the first passivation layer covers a portion of the upper conductive layer and exposes the upper conductive layer via a first opening, wherein the first passivation layer is a single continuous layer and is in direct contact with the dielectric layer;

a bond pad, wherein the bond pad covers a portion of the first passivation layer, and wherein the bond pad fills the first opening in the first passivation layer to form a first ring recess and a second ring recess spaced from the first ring recess, and at least one of the first ring recess region or the second ring recess region is a discontinuous ring, and wherein the bond pad comes in contact with the upper conductive layer exposed by the first opening; and a second passivation layer, wherein the second passivation layer covers at least the recess region in the bond pad.

2. The bond pad structure of claim 1, wherein the bond pad structure further comprises:

the upper conductive layer, wherein the upper conductive layer has a size about the same as the bond pad and is disposed directly under the bond pad;

a lower conductive layer, wherein the lower conductive layer also has a size about the same as the bond pad and is disposed directly below the upper conductive layer; and conductive vias disposed between the upper conductive layer and the lower conductive layer to provide electrical connection between the conductive layers.

3. The bond pad structure of claim 1, wherein the second passivation has a second opening exposing a portion of the bond pad.

4. The bond pad structure of claim 3, wherein the second opening has a width in a range from about from about 20 μm to about 100 μm.

5. The bond pad structure of claim 1, wherein the first opening has a width in a range from about 1,000 Å to about 40,000 Å.

6. The bond pad structure of claim 1, wherein the aspect ratio of the first opening is equal to or less than about 2.

7. The bond pad structure of claim 1, wherein a distance between an edge of the bond pad and a closest edge of the first passivation layer is in a range from about 0.1 μm to about 1.0 μm.

8. The bond pad structure of claim 1, wherein a distance between an edge of the bond pad and a closest edge of the second passivation layer is in a range from about 5,000 Å to about 30,000 Å.

9. The bond pad structure of claim 1, wherein a distance between an edge of the second passivation layer and a closest edge of the first passivation layer is equal to greater than about zero.

10. The bond pad structure of claim 1, wherein the bond pad is disposed over at least a portion of active circuitry of an integrated circuit.

11. The bond pad structure of claim 1, wherein bond pad structure is disposed over input/output (I/O) cell of an integrated circuit.

12. The bond pad structure of claim 1, wherein the bond pad includes aluminum or aluminum alloy.

13. The bond pad structure of claim 1, wherein each of the first passivation layer and the second passivation layer includes silicon oxide, silicon nitride, silicon oxynitride, or a combination thereof.

14. A bond pad structure, comprising:

an upper conductive layer;

a lower conductive layer, wherein the lower conductive layer is below the upper conductive layer;

conductive vias disposed between the upper conductive layer and the lower conductive layer to provide electrical connection between the conductive layers;

a first passivation layer, wherein the first passivation layer covers a portion of the upper conductive layer and exposes the upper conductive layer via a first opening;

a bond pad, wherein the bond pad covers a portion of the first passivation layer, and wherein the bond pad covers the first opening in the first passivation layer to form a ring of discontinuous recess regions, wherein each recess region of the ring of recess regions is recessed with respect to a top surface of the bond pad, and wherein the bond pad comes in contact with the upper conductive layer exposed by the first opening; and a second passivation layer, wherein the second passivation layer covers at least one of the recess regions of the ring of recess regions in the bond pad so that the ring of discontinuous recess regions surrounds a portion of the bond pad exposed by the second passivation layer.

15. The bond pad structure of claim 14, wherein the upper conductive layer has a size about the same as the bond pad and is disposed directly under the bond pad, and wherein the lower conductive layer also has a size about the same as the bond pad and is disposed directly below the upper conductive layer.

16. A method of forming a bond pad structure on a substrate, comprising:

forming an upper conductive layer embedded in a dielectric layer on the substrate;

forming a first passivation layer over the upper conductive layer, wherein the first passivation layer has a first opening, and wherein the first opening exposes the upper conductive layer, and the first passivation layer is a single continuous layer and is in direct contact with the dielectric layer;

forming a bond pad over the first passivation layer, wherein the bond pad covers the first opening in the first passivation layer to form a first ring recess region and a second ring recess region spaced from the first ring recess region, wherein at least one of the first ring recess region or the second ring recess region is a discontinuous ring;

forming a second passivation layer, wherein the second passivation layer covers at least the recess region in the bond pad.

17. The method of claim 16, further comprising: pre-treating the substrate after the bond pad is formed and before the second passivation layer is formed to remove residues in the recess region, wherein the pre-treating process may be a sputtering process, a plasma process, or an annealing process.

18. The method of claim 16, wherein the second passivation layer is deposited by a plasma process, wherein the plasma removes residues in the recess region.

19. The method of claim 16, wherein the second passivation layer covers at least the recess region in the bond pad to prevent residues resulting from the forming of the second passivation layer from being trapped in the recess region.

20. The method of claim 16, wherein the second passivation layer covers at least the recess region in the bond pad to reduce corrosion of the bond pad.

* * * * *